*INVENTORS*
JAMES P. CALLAHAN
RICHARD A. STARK

CERAMIC CHIP ELECTRICAL COMPONENTS

INVENTORS
JAMES P. CALLAHAN
RICHARD A. STARK

CERAMIC CHIP ELECTRICAL COMPONENTS

INVENTORS
JAMES P. CALLAHAN
RICHARD A. STARK

United States Patent Office
3,618,202
Patented Nov. 9, 1971

3,618,202
CERAMIC CHIP ELECTRICAL COMPONENTS

James P. Callahan, Woodland Hills, Calif., and Richard A. Stark, Des Plaines, Ill., assignors to P. R. Mallory & Co. Inc., Indianapolis, Ind.
Continuation-in-part of application Ser. No. 625,459, Mar. 23, 1967. This application May 12, 1969, Ser. No. 823,667
Int. Cl. B01j *17/00;* H01j *5/00*
U.S. Cl. 29—580 37 Claims

ABSTRACT OF THE DISCLOSURE

The disclosure presents a miniature ceramic chip capacitor primarily for use in hybrid integrated circuits. The capacitor electrodes are external and coplanar, being separated by a recess in the ceramic body. A pattern of grooves defining a number of capacitors and their electrode surfaces is embossed or formed on one surface of a green ceramic film usually having a plastic binder. An electrode is applied to the coplanar electrode surfaces of the matured ceramic body such as an electrode paste by a printing operation. PN-junction dielectric layers can be formed, if desired, beneath the electrode surfaces by alloying and thermal reoxidation.

This application is a continuation-in-part application of application Ser. No. 625,459, filed Mar. 23, 1967, now abandoned.

This invention relates to ceramic chip electrical components and, more particularly, to ceramic chip capacitors including capacitors containing PN-junction dielectric layers for use in, for example, hybrid integrated circuits.

Miniature chip capacitors and other chip components are useful primarily in connection with hybrid integrated circuits and microminiaturized printed circuits. Ceramic chip capacitors provide higher capacitance values than those attainable in monolithic integrated circuits. In order to meet its intended uses, a chip capacitor should enclose a high electrical capacitance within a small volume; it should also be capable of simple and inexpensive manufacture. Additionally, hand positioning and assembly of the capacitors into a circuit should be eliminated to the greatest possible extent. Furthermore, since such components are essentially custom-made in batches to a circuit manufacturer's capacitance, voltage, size and shape requirements, tooling and set-up costs should be low.

It is accordingly an object of the present invention to provide miniature chip components having inherently coplanar electrodes for direct assembly into printed of integrated circuits, and to provide such components having a form and structure easily adaptable for use with common automated handling and assembly equipment.

It is another object of the invention to provide a simple, inexpensive and efficient method of fabricating ceramic chip components by embossing and printing to eliminate all requirements for precision masking and registration operations and to limit the specialized tooling for making one particular component to a single, inexpensive die.

It is a further object of the invention to provide an apparatus for manufacturing a class of coated ceramic articles by a novel combination of conventional and readily available elements from several different areas of technology. That is, the present invention provides an apparatus having a versatility allowing its use in fields other than that toward which the process and product of the invention are primarily directed.

Other objects and advantages, as well as modifications obvious to one skilled in the arts to which the invention pertains, will become apparent from the following description taken in conjunction with the accompanying drawings, in which.

Figure 1:
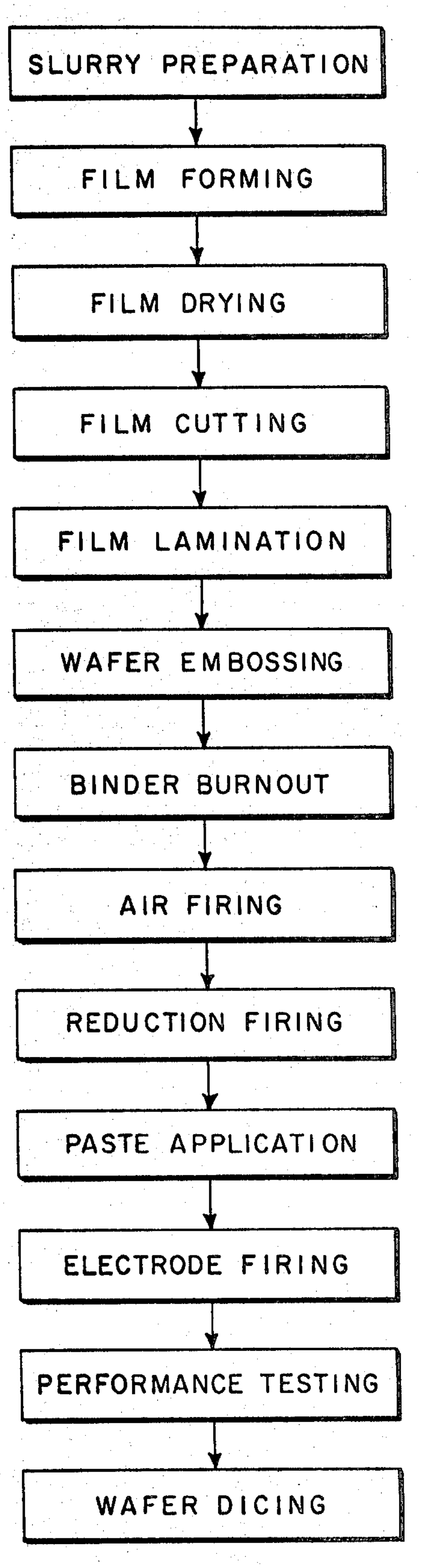
FIG. 1 is a block diagram of a process according to the invention.

Referring more particularly to the drawings, a ceramic material is first prepared as a fine-textured slurry from the raw ingredients by a means generally indicated by the numeral 10, here shown to be a blade-type mixer having a container 11 provided with a shaft 12 carrying a number of rotating blades 13 and driven by a motor 14. This type of mixer can be used in preference to a ball mill or other means to insure faster and more even dispersion of the ingredients and to avoid breaking down the emulsion from excessive mechanical action. The constituents of the slurry usually include, in addition to ceramic filler, a plastic or flowable temporary binder and other conventional materials such as release agents and anti-foaming agents. If the ceramic material is to be subsequently reduced as described hereinafter, it should be a form of oxide ceramic. Thermoplastic binders such as polyvinyl alcohol, polyvinyl chloride, nitrocellulose and arcylic are desirable in that they are volatile and leave a low ash content in the mature ceramic. The percentage of binder required is somewhat higher than normal usage in other applications; binder content typically ranges from 12 to 15 percent. For the sake of continuity, the example of a chip capacitor using a barium titanate oxide ceramic and a thermoplastic binder will be followed throughout the description. In general, the alkaline earth titanate and zirconate families of ceramic and titanium dioxide have been found suitable for the present purposes.

Figure 2:
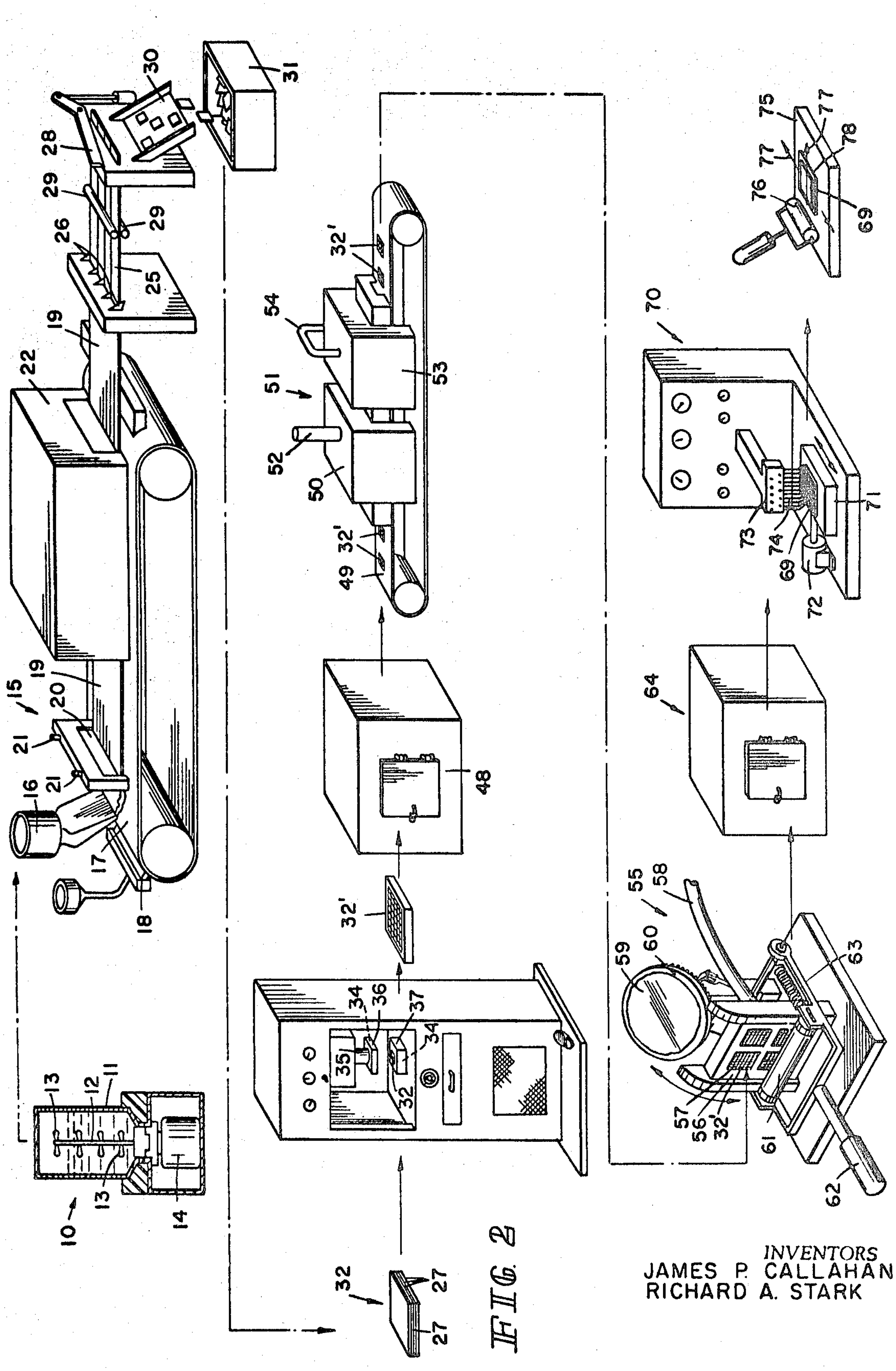
FIG. 2 illustrates, in simplified forms and partial schematic, elements of an apparatus according to the invention, some of the elements being drawn to different scales.

The slurry is next formed into a film by casting, extrusion, spraying or other means. The casting technique yields good results with a minimum of cost and complexity. FIG. 2 illustrates a continuous film-casting machine 15, in which the slurry is fed from a hopper 16 onto a driven stainless steel belt 17. The belt 17 is coated with a separate release agent such as silicone oil or ammonium stearate by a wick 18 to prevent the film from sticking thereto. Alternatively, the belt 17 may be coated with a permanent release agent such as Teflon. As the slurry moves along the belt, it is formed into a continuous film 19 by passing under a doctor blade 20 whose height above the belt 17 is precisely controlled by the micrometer screws 21. The wet film is dried in an oven 22; drying a 6-mil thick film typically requires approximately 5 minutes at 250° F. The green film 19 then emerges from the oven 22 and is removed from the belt 17 by a parting blade 23. At this point the film 19 has sufficient mechanical strength and flexibility to withstand tensile stress and handling without damage.

A film cutting unit, indicated generally by 24, accepts the green film 19 from the casting machine 15. The film is first sheared into strips 25 by a series of knives 26 and then into pieces or squares 27 by a cut-off knife 28. The rollers 29 support the strips 25 and pull them through the cutting unit 24. The squares 27 slide down a chute 30 into a bin 31. Maximum size of the squares 27 is limited primarily by the extent to which warping during air firing can be tolerated in subsequent steps, as will be more fully described hereinafter. Presently used squares may typically range from 1 to 4 inches on a side.

Capacitors made by the present technique are commonly about 15 mils thick, but the film-casting process is most economical and efficient at a film thickness of 4 to 7 mils. Therefore, the sheared squares 27 are stacked to form a laminated wafer 32 of the desired thickness. Lamination also provides a greater mechanical strength and eliminates any pin-hole defects which may occur because of trapped air in the individual squares 27. The squares 27 may conveniently be stacked by hand as the resulting wafer 32 is placed in the embossing unit 33. The wafer 32 is coated with a release agent and heat and pressure are applied thereto by means of heating elements 34 and a hydraulic cylinder 35 acting through a die 36 and a pressure block 37. The parameters will vary with the type of binder used and with other factors; typical ranges are 75–400° F. and 1000–20,000 p.s.i. The embossing operation impresses the pattern of the die into the wafer 32; it also bonds the individual squares 27 inextricably together and acts to remove any remaining air bubbles from the wafer. Although more sophisticated embossing means could be used, such as the continuous rolling dies found in the plastics industry, it is felt that the relatively small amounts of material required for even a very large number of individual components and the small size of the wafers will rarely justify the expense of the more complicated machinery, dies and handling equipment.

Figures 3, 4, 5, 6, 7:
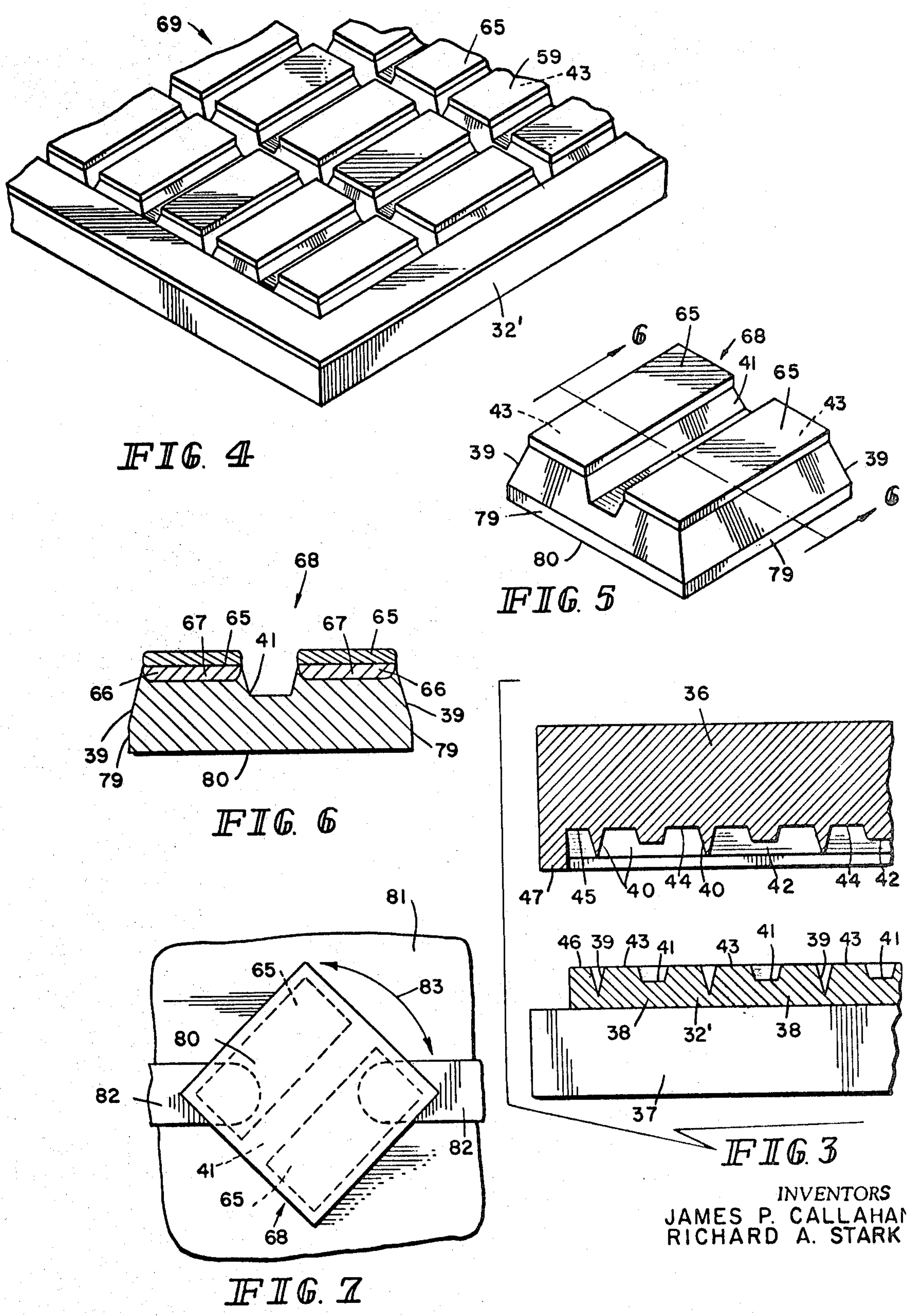
FIG. 3 is a cross-sectional view of an embossing die and a ceramic wafer of the invention.
FIG. 4 is a perspective view of a completed ceramic wafer according to the invention.
FIG. 5 shows an individual chip capacitor unit diced from the wafer of FIG. 4.
FIG. 6 is a cross-sectional view of a capacitor unit taken along the line 6—6 of FIG. 5.
FIG. 7 shows the capacitor unit of FIG. 5 mounted in a circuit.

FIG. 3 shows an enlarged cross-sectional view of the embossing die 36 and the embossed and bonded wafer 32. The boundaries of the individual capacitor units 38 are defined by a set of reticulate grooves 39 formed by corresponding ridges 40 in the die 36. The grooves 39 are V-shaped in order to provide cleavage lines for dicing the wafer at a later stage; they also inhibit warping of the wafer during firing to some extent. A series of shallow recesses or substantially U-shaped grooves 41 is formed in the wafer by corresponding ridges or ribs 42 in the die. The draft angles of the ribs 42 are only sufficiently great to allow proper release of the wafer from the die. The shape and shallowness of the recesses or grooves 41 insures that the capacitor units 38 will not be broken in half when the wafer 32 is diced. The coplanar surfaces 43 are maintained in a flat condition by the action of the depressed surfaces 44 of the die. The depression 45 provides a flange 46 around the edges of the wafer 32' to avoid imperfections in the outermost capacitors of the wafer. A wall 47 may surround the depression 45 to trim the edges of the wafer 32' and to insure proper formation of the pattern thereon by preventing leakage of the wafer material from the sides of the die 36. The wafer material becomes hot enough to flow to some extent during the embossing operation, and the wall 47 gives a coining effect to this operation. It will be noted that the die 36 presses and flows the wafer material rather than cutting it, so that the material is pushed laterally away from the grooves 39 and downward in the areas underlying the grooves 41. Therefore, the material under the latter grooves is compacted and strengthened, while that under the grooves 39 is not so strengthened; this effect further assures that cleavage will occur along the proper lines. In a typical wafer of 15-mil thickness, the grooves 39 will be approximately 10 mils deep and the recesses or grooves 41 approximately 5 mils deep.

The die 36 must be made of a hard material to withstand a large number of embossing operations without undue wear. Hardened beryllium copper is a suitable die material in this regard; for short production runs, an inexpensive epoxy die is feasible. In practice, the die is made easily and inexpensively by casting the molten die material into a mold (not shown) having a face containing the grooved pattern of the wafer 32'. Since the grooves 39 and 41 usually extend continously across the surface of the entire wafer, the corresponding grooves may be easily machined into the mold by a simple milling operation. The die is cast into the mold and then hardened by conventional methods. The die 36 may also be made by an investment casting process. It will be noted that the die 36 is the only specialized tooling required for a particular production run, so that short runs of components built to custom specifications of size and shape are eminently practical.

The formed or embossed wafer can be prepared by many and various methods other than as previously described. For example, a fine-textured ceramic slurry can be formed as previously described and then dried to a powder such as by spray-drying in any conventional spray drying equipment. The formed or embossed wafer is then prepared by filling a cavity or die having the general shape as the wafers previously described including a pattern which, when the powder is pressure pressed, results in a surface of the wafer having the co-planar surfaces and the reticulate grooves. This compacted formed or embossed wafer can then be processed in generally the same or similar manner as the previously described wafer 32'.

The embossed wafer 32', still in a relatively strong and flexible condition, can next be transferred to a furnace 48 for binder burnout when a binder is used. The plastic binder is here volatilized and driven out of the ceramic, its function of providing strength and flow characteristics to the green ceramic having been performed. Temperature cycles for burnout depend upon the particular binder material employed and with its weight percentage. For a 12% polyvinyl chloride binder, furnace temperature may conveniently be changed in one-hour steps in the cycle 400–600–800–900–1000° F. It will be appreciated that other methods of removing the temporary binder from the green ceramic are equally satisfactory. The ceramic material itself is not affected by this step, except for a mechanical weakening occasioned by loss of the binder.

After its removal from the furnace 48, when a binder burnout is necessary, the wafer 32' is placed on a driven belt 49 for sintering or firing in a first kiln 50 of an apparatus 51. There the wafer 32' is matured by the application of heat in an air atmosphere, maintained by the flue 52. For a barium titanate ceramic, this conventional air firing step requires approximately 2 hours at a temperature of 2400° F., plus cool-down time. Although air firing could be accomplished in the furnace 48 after the burnout step, contamination of this furnace by the binder products remaining therein makes it desirable to fire in a separate furnace or kiln. Air firing shrinks the wafer approximately 20% in its linear dimensions; it also tends to warp the wafer somewhat, as was mentioned previously. The mature oxide ceramic may be made semiconducting for many of the applications envisaged by the invention; therefore, a second kiln 53 of the apparatus 51 is provided with a reducing atmosphere by a hydrogen delivery pipe 54. Still using the example of a barium titanate capacitor, the removal of oxygen by the hydrogen yields an excess of titanium in the ceramic, which has the effect of making the ceramic an N-type polycrystalline semiconductor. The reduction process is continued until a sufficiently low and homogeneous bulk resistivity is attained. Barium titanate wafers 15 mils thick typically require one hour at 2500° F. for proper reduction.

Although many applications may utilize a barrier layer dielectric or reduced ceramic electrical component, the ceramic electrical component can also be used in the bulk dielectric or un-reduced ceramic form.

The matured and, if desired, reduced wafer 32' exits the compartment 53 on the belt 49 and is transferred for electrode application to a printing means 55, here shown as a conventional and inexpensive hand printing press. A number of wafers 32' is held on the platen 56 by a vacuum holder 57 supplied by a vacuum line 58. An electrode paste 59 is placed on the rotatable inking plate 60; an inking roller 61 picks up the paste from the inking plate and applies it to the raised coplanar surfaces 43 of the wafer 32' by movement of the handle 62 and yoke 63. The paste 59 contains an electrode material of a noble metal, such as palladium, platinum or gold, or silver in flake or particle form and a bonding agent of a glassy nature, such as glass particles; it also contains a low-temperature adhesive and a vehicle to give the paste the proper consistency to cause it to adhere to the surfaces 43 in the same manner in which ink is applied to an engraved plate in the printing of papers; that is, the consistency of the paste is such that it remains on the surfaces 43 and does not run into the grooves 39 and 41. It is by this technique of embossing and printing that all conventional requirements for expensive photographic or silk-screen masks and precision mask alignment can be eliminated. In effect, the embossed wafer 32' is made to serve as its own template, and the electrode paste 59 is thus automatically applied to the correct areas. A limiting factor in this printing process arises from an increased warping of the wafers 32' as their size is increased, which ultimately results in an uneven distribution of paste onto the surfaces 43. This problem, however, may be alleviated by several methods. The effect of the grooves 39 has been mentioned previously in this connection. Other solutions include the special selection of ceramic materials to reduce warping during air firing and modification of the standard rubber printing roller 61 to allow it to follow the gentle curves of the warped surfaces but not the sharp angles of the grooves 39 and 41.

An electrode firing step follows the electrode paste application. This operation typically requires approximately 15 minutes at a temperature of 1400–1500° F. in a furnace 64. Electrode firing is normally done in air, although a different atmosphere may be desirable in some cases, as will be pointed out hereinafter. A basic purpose of electrode firing is to diffuse the materials of the electrode paste into the surfaces 43 of the ceramic wafer material. Diffusion of the metal and glassy materials into the ceramic of course bonds the electrode layer 65 thereto, and the low-temperature adhesive may therefore be driven out during firing. But the diffused constituents of the paste can also act as a P-type dopant, so that PN junctions 66 can be created in the alloyed regions 67. Since the semiconducting ceramic has a low bulk resistivity, the junctions 66 become the dielectric of the completed individual capacitor units 68. The two junctions 66 of an individual unit are placed back-to-back, so that one of them is always reverse-biased and the capacitor 68 is therefore nonpolarized. The U-shaped medial recess or groove 39 prevents the capacitor from being short-circuited by contact directly between the two alloyed regions 67.

If the electrode firing on a reduced ceramic takes place in the presence of oxygen, parts of the reduced ceramic will be thermally reoxidized to some extent. More specifically, reoxidation occurs in the alloyed regions 67, imparting an error function gradation to the PN junctions 66. In effect, the reoxidation forms another dielectric, which decreases the capacitance of the unit 68. The decrease in capacitance, however, is usually accompanied by an increase in voltage rating, a lower leakage current, and less voltage-dependence of the capacitance. Reoxidation also usually increases the mechanical strength of the bond between the electrode layers 65 and the ceramic. The use of an atmosphere other than air in the electrode firing step will of course influence the rate at which thermal reoxidation proceeds; in addition, the use of a low firing temperature over a long time interval promotes the alloying or diffusion process, while a high temperature applied over a short interval enhances reoxidation. That is, the rates of diffusion and reoxidation may be differentially controlled to obtain certain desired characteristics in the capacitor.

The metallic electrodes can also be applied by many and various methods other than the previously described method; for example, by screening or open mesh methods utilizing metallic paints or pastes and then subsequently firing or by direct application methods which include forming a metallic electrode layer by sputtering, electroless deposition, vapor deposition and the like.

Capacitance tolerance and other electrical tests of the indvidual units 68 can be performed, if desired, on a wafer test unit 70. The completed wafer 69, the wafer 32' being a substrate or body thereof, is placed on a jig 71 which is coupled to a low-speed servo drive 72. As the units 68 pass under the test head 73, they are contacted by a row of adjustable probes 74 and the appropriate measurements are taken. Since the electrodes 65 constitute a large part of the total area of each capacitor 68, extreme precision in the adjustment of the jig 71 and probes 74 is unnecessary. In fact, the grooves 39 and 41 in the wafer 69 make an even more automatic tester feasible, since these grooves may be used as guides for the probes 74. A considerable portion of the cost of mass-produced microminiature components results from the necessity for manual testing procedures. The present invention reduces this burden by providing an inherent means for automatic testing. Because the capacitors 68 are checked in situ on the wafer 69, a method of identifying defective units is required. To this end, the probes 74 may for instance, be fed with a magnetic ink to be released by the test unit onto defective units for culling by a magnetic sensor (not shown) prior to packaging.

A further advantage of the present invention appears in the wafer dicing, whereby the individual capacitors 68 are separated from each other for packaging and shipment. Placing the wafer 69 on a soft rubber pad 75 and passing a hard roller 76 of small diameter thereover in the directions of the arrows 77 will break the wafer cleanly along the reticulate grooves 39. A piece of adhesive tape 78 under the wafer 69 prevents the small pieces from scattering as they are broken. As has been mentioned, the absence of compaction in the vicinity of these grooves and their sharp V shape promote cleavage therealong. The resulting edges 79 appear smooth and perpendicular to the base surface 80 of the capacitor 68 even under a microscope. Conversely, no evidence of fracture has been observed in the U-shaped medial recesses or grooves 1. The simplicity of this dicing step may render it feasble in some cases to ship the wafers intact for dicing by the buyer, in order to reduce counting and packaging costs.

FIG. 7 shows a completed chip capacitor 68 positioned on the substrate 81 of a portion of hybrid integrated circuit or a miniature printed circuit. The capacitor 68 is placed face downward on the substrate 81 so that the electrodes 65 meet the contact pads 82 of the circuit; these elements are then soldered or joined by other conventional means. To avoid the handling of a multiude of small pieces, automatic means are commonly used in the industry to feed, position and orient such components. Rotational orientation about an axis perpendicular to the plane of the component may conveniently be accomplished with guides operating from a vibratory feeder. It will be noted from FIG. 7 that a quadrantal ambiguity in rotation of a square component in the direction of the arrow 82 may be rendered harmless by diagonal mounting on the pads 82. A much more severe problem occurs in attempting to distinguish between the upper and lower surfaces for orientation purposes. Because conventional chip components are featureless except for thin contact stripes deposited on one face, the vacuum holder usually employed for positioning cannot differentiate between these two surfaces without some form of sensing equipment. The present unit 68, however, has a substantially deep groove 41 running the length of the surface to be placed downward on the substrate 81. Therefore, a vacuum holder cannot pick up the unit 68 except by the face 80 because of air leakage through the groove 41. Units thus rejected for improper presentation then return to the vibratory feeder for another pass. Accordingly, a major advantage of components fabricated in the present manner resides in the fact that the means most commonly used for automatic parts placement may be made to serve without auxiliary equipment as an orientation discriminator. It is also possible, of course, to provide a ridge on a handling machine or feeder, the ridge being keyed to the groove 41 for proper orientation of the component 68; furthermore, the difference in light reflective characteristics between the layers 65 and the surface 80 will allow the use of a photoelectric means as an orientation discriminator.

Chip capacitors according to the invention may vary greatly in size. A capacitor 60 mils square typically has a capacitance range of approximately 50 picofarads at a design rating of 50 volts to 15,000 picofarads at 3 volts. Electrical parameters of the unit may be adjusted in a number of ways. Changing the outer dimensions or the width of the grooves 41 will of course influence the capacitance; it has been remarked that such dimensional changes involve merely the substitution of a different embossing die. Variation of capacitance and voltage rating by tailoring the respective diffusion and reoxidation rates during electrode firing has been mentioned. It is also possible to adjust the capacitance by proper selection of electrode materials, since different materials have different diffusion rates on a given electrode surface.

It has been found that capacitors fabricated according to the invention have a nonlinear, voltage-dependent leakage resistance, decreasing from extremely high at low voltages to a lower value at the dielectric breakdown voltage. Consequently these capacitors are voltage-rated at a point above which the leakage current begins to increase to an objectionable extent. Since catastrophic breakdown of the dielectric does not occur until a much higher voltage is reached, irreversible failure of the capacitor is avoided even at large voltage overloads. It may also be desirable to employ the capacitor intentionally as a high-value nonlinear resistor and thereby take direct advantage of this characteristic as a circuit design feature.

It will be appreciated from the above description that the novel process of the present invention is applicable to the fabrication of electrical chip components other than capacitors by obvious geometrical modifications of the embossing die and minor adjustments in other stages, and that such components will enjoy the advantages of the chip capacitor more particularly pointed out. It will also be appreciated that the advantages of the present capacitor unit resulting from its novel structure are not dependent upon the particular method of its fabrication. Furthermore, it will be realized that the apparatus and instrumentalities described in connection with the manufacturing method are not limited thereto or to the field toward which the invention is primarily directed; that is, the units of the apparatus disclosed are both separately and collectively versatile. Therefore, having described the foregoing preferred embodiments by way of illustration rather than by way of limitation, we claim as our invention:

1. A method for fabricating ceramic chip electrical components, comprising the steps of forming on a ceramic wafer a plurality of substantially coplanar surfaces with shallow recesses therebetween and separated into components by a groove, sintering said wafer to mature the ceramic material thereof, applying electrodes to said coplanar surfaces on said wafer, and dicing said wafer along said groove to separate said wafer into components.

2. A method according to claim 1, wherein said groove is substantially V-shaped for efficient breaking of said wafer into said components.

3. A method according to claim 1, including the step of reducing said ceramic material to render the same semiconducting after said ceramic wafer has been sintered and before the electrodes have been applied to said coplanar surfaces.

4. A method according to claim 2, wherein said recesses are substantially U-shaped.

5. A method according to claim 4, wherein said ceramic wafer contains a flowable binder and including the step of driving said binder from said wafer.

6. A method according to claim 5, wherein said electrodes are applied as an electrode paste to said coplanar surfaces and including the step of firing said wafer whereby a constitutent of said electrode paste diffuses into and bonds to said coplanar surfaces.

7. A method according to claim 6, wherein said ceramic wafer is prepared by preparing a slurry of a ceramic material and a flowable binder therefor, forming a film from said slurry and drying said film.

8. A method for fabricating a ceramic capacitor comprising the steps of preparing a slurry of a ceramic material and a flowable binder, forming and drying said slurry into a plurality of pieces, embossing a wafer comprising at least one of said pieces with a pattern of substantialy coplanar surfaces, driving said flowable binder out of said wafer, maturing said ceramic material by firing said wafer, applying a layer of a paste to said coplanar surfaces, and firing said wafer to bond said layer to said coplanar surfaces.

9. The method of claim 8, wherein said binder is an organic thermoplastic material.

10. The method of claim 8, wherein said pieces are films formed by casting said slurry to form a wet film, drying said film and cutting said dried film.

11. The method of claim 8, wherein said wafer is a laminate comprising a plurality of said pieces, said laminate being bonded together by heat and pressure during said embossing step.

12. The method of claim 8, wherein said binder is driven out of said wafer in a binder burnout step comprising the application of sufficient heat to said wafer to volatilize said binder.

13. The method of claim 8, wherein said paste comprises a metallic flake material and an adhesive causing said paste to adhere to said coplanar surfaces.

14. The method of claim 8, wherein said wafer contains a plurality of said ceramic articles, said articles being separable from each other by breaking said wafer.

15. A method for fabricating ceramic chip electrical components, comprising the steps of preparing a slurry of an oxide ceramic material and a plastic binder therefor, forming a film from said slurry, drying said film and cutting the same into pieces, embossing a wafer comprising at least one of said pieces with a pattern of substantially coplanar surfaces separated by a plurality of reticulate grooves, driving said binder from said wafer, air-firing said wafer to mature the ceramic material thereof, reducing said ceramic material to render the same semiconducting, applying to said coplanar surfaces a layer of electrode paste, firing said wafer, whereby a constituent of said electrode paste diffuses into bonds to the ceramic material of said coplanar surfaces, and dicing said wafer along at least some of the grooves to separate the wafer into individual components.

16. The method of claim 15, wherein said wafer contains a plurality of said electrical components and wherein a set of said reticulate grooves separates said individual components from each other on said wafer.

17. The method of claim 16, wherein said reticulate grooves comprising said set of reticulate grooves are substantially V-shaped for efficient breaking of said wafer into said individual components.

18. The method of claim 16, wherein said coplanar surfaces are partially defined by a series of spaced grooves, said series of spaced grooves being a part of said plurality of reticulate grooves.

19. The method of claim 18, wherein the grooves of said series are substantially U-shaped.

20. The method of claim 15, wherein said electrode paste comprises an electrically-conductive material in the form of small flakes and an adhesive therefor.

21. The method of claim 20, wherein said adhesive is a low-temperature adhesive capable of being expelled from said paste during firing of said wafer.

22. The method of claim 20, wherein said electrode paste further comprises a bonding agent for promoting the diffusion and bonding of said layer of electrode paste.

23. The method of claim 20, wherein said electrically-conductive material serves as a dopant for said semiconducting ceramic material.

24. The method of claim 23, wherein said semiconducting ceramic material has a preselected conductivity type and wherein said dopant is of opposite conductivity type, whereby the firing of said wafer establishes a PN junction within said ceramic material beneatth each of said coplanar surfaces.

25. The method of claim 15, wherein said ceramic material is chemically reduced by the application of heat thereto in a reducing atmosphere.

26. The method of claim 25, wherein said reducing atmosphere includes hydrogen gas.

27. A method for fabricating a plurality of chip capacitors from a ceramic wafer, comprising the steps of preparing a slurry of an oxide ceramic material and a flowable binder therefor shaping said slurry into a plurality of dried film pieces, embossing a wafer comprising at least one of said pieces with a pattern of coplanar surfaces separated by a set of reticulate, substantially V-shaped grooves and a series of spaced, substantially U-shaped grooves, driving said binder out of said wafer and maturing the same by the application of heat thereto, converting said oxide ceramic material into a polycrystalline semiconductor of a particular conductivity type by chemical reduction thereof, rolling a layer of an electrode paste, containing a dopant material of opposite conductivity type, only onto said coplanar surfaces, diffusing said dopant material into said ceramic material to form a plurality of PN-junction dielectric regions in said ceramic material, testing said wafer for selected electrical parameters of the individual chip capacitors therein, and dicing said wafer along said V-shaped grooves to separate said individual capacitors.

28. The method of claim 27, wherein said V-shaped grooves are made substantially deeper than said U-shaped grooves in order to inhibit fracture of said wafer along said latter grooves.

29. The method of claim 27, wherein said binder is driven out by heat insufficient substantially to affect said ceramic material, said ceramic material being subsequently matured.

30. The method of claim 27, wherein said ceramic material is selected from the group consisting of the alkaline earth titanate and zirconate families and titanium dioxide.

31. The method of claim 27, wherein said dopant material is a metal in the form of small particles.

32. The method of claim 31, wherein said metal is selected from the class consisting of silver, palladium, platinum and gold.

33. The method of claim 27, wherein said electrode paste contains a bonding agent having a glassy nature for promoting the diffusion of said layer into said ceramic material.

34. The method of claim 27, wherein said diffusion is accomplished by firing said wafer at a controlled temperature for a predetermined time interval.

35. The method of claim 34, wherein said firing is performed in an atmosphere containing an amount of oxygen, whereby portions of said reduced ceramic material are thermally reoxidized.

36. The method of claim 35, wherein said temperature, time interval and amount of oxygen are controlled for the purpose of regulating the respective rates of said diffusion and said reoxidation.

37. The method of claim 27, wherein said dicing is performed by flexing said wafer, whereby said individual capacitors are broken apart along said V-shaped grooves.

References Cited

UNITED STATES PATENTS

| | | | |
|---|---|---|---|
| 2,775,023 | 12/1956 | Hedding | 29—581 |
| 3,465,427 | 9/1969 | Barson et al. | 29—574 |
| 3,386,856 | 6/1968 | Noorlander | 29—25.42 |
| 3,342,655 | 9/1967 | Crownover | 156—89 |
| 3,340,601 | 9/1967 | Garibotti | 29—582 |
| 3,235,939 | 2/1966 | Rodriguez et al. | 29—25.42 |
| 2,750,657 | 6/1956 | Herbert | 29—155.5 |

JOHN F. CAMPBELL, Primary Examiner

D. M. HEIST, Assistant Examiner

U.S. Cl. X.R.

29—589, 574